United States Patent [19]

Iwasaki

[11] Patent Number: 6,128,173
[45] Date of Patent: Oct. 3, 2000

[54] SEMICONDUCTOR INTEGRATED CIRCUIT DEVICE HAVING PROTECTIVE TRANSISTORS WITH P-N JUNCTION BROKEN DOWN EARLIER THAN BREAKDOWN OF GATE INSULATOR OF COMPONENT TRANSISTORS

[75] Inventor: Tadashi Iwasaki, Tokyo, Japan

[73] Assignee: NEC Corporation, Tokyo, Japan

[21] Appl. No.: 09/173,163

[22] Filed: Oct. 15, 1998

[30] Foreign Application Priority Data

Oct. 16, 1997 [JP] Japan ................................... 9-283745

[51] Int. Cl.$^7$ .................................................. H02H 3/22
[52] U.S. Cl. .......................... 361/111; 361/56; 257/356; 257/358
[58] Field of Search ...................... 361/54, 56, 58, 361/91.1, 88, 91.5, 111; 257/355, 357, 362, 368, 367; 327/309, 310, 318, 306

[56] References Cited

U.S. PATENT DOCUMENTS

| | | | |
|---|---|---|---|
| 4,115,709 | 9/1978 | Inoue et al. | 327/566 |
| 4,725,915 | 2/1988 | Jwahashi et al. | 361/91 |
| 4,760,433 | 7/1988 | Young et al. | 257/357 |
| 5,610,425 | 3/1997 | Quigley et al. | 257/358 |
| 5,610,790 | 3/1997 | Staab et al. | 361/56 |
| 5,917,689 | 6/1999 | English et al. | 361/56 |

FOREIGN PATENT DOCUMENTS

| | | |
|---|---|---|
| 63-115363 | 5/1988 | Japan . |
| 1-253951 | 10/1989 | Japan . |
| 3-21057 | 1/1991 | Japan . |
| 3-74870 | 3/1991 | Japan . |
| 7-235604 | 9/1995 | Japan . |

*Primary Examiner*—Josie Ballato
*Assistant Examiner*—Kim Huynh
*Attorney, Agent, or Firm*—Sughrue, Mion, Zinn, Macpeak & Seas, PLLC

[57] ABSTRACT

A semiconductor integrated circuit device includes a first protection circuit for protecting against static charge applied to a signal terminal, a second protection circuit for protecting against static charge applied between a power supply terminal and a ground terminal, and a main circuit protected from the static charge by the first and second protection circuits. The second protection circuit discharges the static charge through a break-down of p-n junctions of the component transistors or punch-through. The main circuit has a field effect transistor having a gate insulating layer, to which is applied the potential difference between the power supply line and the ground line, and having a break-down voltage higher than the break-down voltage of the p-n junction or the punch-through voltage of the second protection circuit, whereby the second protection circuit is effective against the static charge.

16 Claims, 5 Drawing Sheets

SEMICONDUCTOR INTEGRATED CIRCUIT DEVICE HAVING PROTECTIVE TRANSISTORS WITH P-N JUNCTION BROKEN DOWN EARLIER THAN BREAKDOWN OF GATE INSULATOR OF COMPONENT TRANSISTORS

FIELD OF THE INVENTION

This invention relates to a semiconductor integrated circuit device and, more particularly, to a semiconductor integrated circuit device equipped with a protection circuit against static charge.

DESCRIPTION OF THE RELATED ART

An integrated circuit has been complicated and, accordingly, required a large number of circuit components. The integrated circuit is fabricated on a single semiconductor chip. In order to integrate the large number of circuit components on a single semiconductor chip, the circuit components such as field effect transistors have been scaled down. The miniature field effect transistors are expected to operate at high speed, and the manufacturer decreases the thickness of the gate insulating layer. A thin gate insulating layer quickly induces and extinguishes a conductive channel between the source region and the drain region, and the field effect transistor achieves a high switching speed. Although the thin gate insulating layer is desirable for the high switching speed, static charge is liable to damage the thin gate insulating layer. The static charge is applied to conductive pins of the semiconductor integrated circuit device, and is propagated to the gate electrode over the thin gate insulating layer.

The static charge is applied to conductive pins assigned to input/output signals and conductive pins assigned to power voltages. A typical example of the prior art protection circuit for the signal pins is disclosed in Japanese Patent Publication of Unexamined Application No. 1-253951, and another prior art protection circuit for the power supply pins is disclosed in Japanese Patent Publication of Unexamined Application No. 3-74870.

FIG. 1 illustrates a prior art protection circuit, and the prior art protection circuit includes the particular features of the prior art protection circuit disclosed in Japanese Patent Publication of Unexamined Application Nos. 1-253951 and 3-74870.

An electric circuit 1 is connected between a power voltage line 2 and a ground line 3, and a power voltage terminal 4 and a ground terminal are respectively connected to the power voltage line 2 and the ground line 3. An input signal Sin is supplied from an input signal terminal 6 to an input inverter 7, and the input inverter 7 supplies the complementary input signal to the electric circuit 1. The electric circuit 1 is responsive to the complementary input signal so as to produce an output signal and the complementary output signal, and the output signal and the complementary output signal are supplied from the electric circuit 1 to an output inverter 8. The output inverter 8 is connected between the power supply line 2 and the ground line 3, and supplies one of the output signal and the complementary output signal to an output signal terminal 9.

A protection circuit 10 for the input signal terminal 6 and a protection circuit 11 for the power supply terminal 4 and the ground terminal 5 are connected in parallel between the power supply line 2 and the ground line 3, and the protection circuits 10 and 11 are designed as proposed by Japanese Patent Publication of Unexamined Application Nos. 1-253951 and 3-74870, respectively.

The input inverter 7 and the output inverter 8 are implemented by a series combination of a p-channel enhancement type field effect transistor Qp1 and an n-channel enhancement type field effect transistor Qn1 and another series combination of p-channel enhancement type field effect transistor Qp2 and an n-channel enhancement type field effect transistor Qn2, respectively, and a diode-connected p-channel enhancement type field effect transistor Qp3 and a diode-connected n-channel enhancement type field effect transistor Qn3 form in combination the protection circuit 10. The diode-connected p-channel enhancement type field effect transistor Qp3 is connected between the power supply line 2 and the input node N1 of the input inverter 7, and allows current from the input node N1 to the power supply line 2. On the other hand, the diode-connected n-channel enhancement type field effect transistor Qn3 is connected between the input node N1 and the ground line 3, and allows current to flow from the input node N1 to the ground line 3.

Japanese Patent Publication of Unexamined Application No. 1-253951 proposes to make the gate insulating layers of the field effect transistors Qp1/Qn1/Qp2/Qn2/Qp3/Qn3 thicker than those of component field effect transistors of the electric circuit 1. As a result, even if static charge is applied to the signal input terminal 6 or the signal output terminal 9, the field effect transistors Qp1/Qn1/Qp2/Qn2/Qp3/Qn3 are hardly damaged, and the diode-connected p-channel enhancement type field effect transistor Qp3 and the diode-connected n-channel enhancement type field effect transistor Qn3 turn on so as to discharge the static charge to the power supply line 2 and the ground line 3.

On the other hand, the protection circuit 11 includes a diode-connected p-channel enhancement type field effect transistor Qp4 and a diode-connected n-channel enhancement type field effect transistor Qn4 both connected between the power supply line 2 and the ground line 3. The diode-connected p-channel enhancement type field effect transistor Qp4 allows current to flow from the ground line 3 to the power supply line 2, and the other diode-connected n-channel enhancement type field effect transistor Qn4 allows the current to flow vice versa. Therefore, the diode-connected p-channel enhancement type field effect transistor Qp4 and the diode-connected n-channel enhancement type field effect transistor Qn4 are usually turned off. When static charge is applied between the power supply terminal 4 and the ground terminal 5, the diode-connected p-channel enhancement type field effect transistor Qp4 or the diode-connected n-channel enhancement type field effect transistor Qn4 turns on so as to discharge the static charge to the power supply line 2 or the ground line 3.

Japanese Patent Publication of Unexamined Application No. 3-74870 proposes to make the gate electrodes of the field effect transistors Qp4/Qn4 wider and shorter than the gate electrodes of the component field effect transistors of the electric circuit 1. The wide and short gate electrode makes the source region and the drain region close to each other, and the channel region has long boundaries with the source/drain regions. For this reason, the p-n junctions of the diode-connected p-channel enhancement type field effect transistor Qp4 and the p-n junctions of the diode-connected n-channel enhancement type field effect transistor Qn4 are broken down earlier than the component transistors, and a large amount of current is discharged to the power supply line 2 or the ground line 3 through the channel regions. As a result, the static charge hardly applies to the gate electrodes of the component transistors.

A problem is encountered in an integrated circuit in that the component transistors of an internal circuit are broken before the protection circuit 11 discharges the static charge. In detail, the electric circuit 1 is assumed to include a two-input NAND gate 1a and a clamping circuit 1b (see FIG. 2). The two-input node NAND gate 1a includes p-channel enhancement type field effect transistors Qp5/Qp6 connected in parallel between the power supply line 2 and an output node N2 and n-channel enhancement type field effect transistors Qn5/Qn6 connected in series between the output node N2 and the ground line 3. One of the two input nodes N3 is connected to the gate electrode of the p-channel enhancement type field effect transistor Qp5 and the gate electrode of the n-channel enhancement type field effect transistor Qn5, and the other input node N4 is connected to the gate electrode of the p-channel enhancement type field effect transistor Qp6 and the gate electrode of the n-channel enhancement type field effect transistor Qn6. The complementary input signal CSin is supplied from the input inverter 7 through the input node N4 to the gate electrode of the p-channel enhancement type field effect transistor Qp6 and the gate electrode of the n-channel enhancement type field effect transistor Qn5. The other input node N3 is connected through the clamping circuit 1b to the power supply line 2, and the a clamping circuit 1b supplies the power voltage to the gate electrode of the p-channel enhancement type field effect transistor Qp5 and the gate electrode of the n-channel enhancement type field effect transistor Qn5 at all times. For this reason, the two-input NAND gate 1a is enabled at all times, and is responsive to the complementary input signal CSin for changing the potential level at the output node N2.

The clamping circuit 1b is implemented by a p-channel enhancement type field effect transistor Qp7. The p-channel enhancement type field effect transistor Qp7 has a source node connected to the power supply line 2, a drain node connected to the input node N3 and a gate electrode connected to the ground line 3. All the component field effect transistors Qp5–Qp7 and Qn5–Qn6 are equal in thickness of the gate insulating layer, and, accordingly, the gate insulating layers thereof are thinner than the gate insulating layers of the field effect transistors Qp1–Qp3 and Qn1–Qn3.

In this situation, when the field effect transistors of the prior art integrated circuit are designed under the minimum design rules of 0.2 micron or less, the manufacturer makes the gate insulating layers Qp5–Qp7 and Qn5–Qn6 of the electric circuit 1 thinner. The gate insulating layer of the p-channel enhancement type field effect transistor Qp7 is damaged due to static charge, because the break-down voltage of the extremely thin gate insulating layer is lower than the break-down voltage of the p-n junction of the diode-connected field effect transistors Qp4/Qn4. For example, when the manufacturer designs the diode-connected field effect transistors Qp4/Qn4 to have the gate electrodes of 50 micron wide and 0.24 micron long and the gate insulating layers of silicon dioxide of 5 nanometers thick and the p-channel enhancement type field effect transistor Qp7 to have the gate electrode of 10 micron wide and 0.20 micron long and the gate insulating layer of silicon dioxide of 5 nanometers thick, the break-down takes place in the diode-connected field effect transistors Qp4/Qn4 at 4.5 volts, and the gate insulating layer of the p-channel enhancement type field effect transistor Qp7 is broken down at 3.0 volts. Thus, the p-channel enhancement type field effect transistor Qp7 is damaged before the punch-through phenomenon.

SUMMARY OF THE INVENTION

It is therefore an important object of the present invention to provide a semiconductor integrated circuit device, component transistors of which are hardly damaged due to static charge.

In accordance with one aspect of the present invention, there is provided a semiconductor integrated circuit device comprising at least one signal terminal supplied with an input signal, a first power supply terminal connected to a first power supply line and supplied with a first power voltage, a second power supply terminal connected to a second power supply line and supplied with a second power voltage different from the first power voltage, a main circuit supplied with the input signal for producing an output signal and including a first field effect transistor having a first gate insulating layer applied with a first potential difference between the first power supply line and the second power supply line and broken down at a first voltage and at least one second field effect transistor having a second gate insulating layer applied with a second potential difference smaller than the first potential difference, and a protective circuit for preventing the main circuit from a static charge and including a first protective sub-circuit having p-n junctions spaced from each other, connected in series between the first power supply line and the second power supply line, reversely biased and providing a current path between the first power supply line and the second power supply line due to a break-down of the p-n junctions or a punch-through under application of the static charge at a second voltage lower than the first voltage.

BRIEF DESCRIPTION OF THE DRAWINGS

The features and advantages of the semiconductor integrated circuit device will be more clearly understood from the following description taken in conjunction with the accompanying drawings in which.

DESCRIPTION OF THE PREFERRED EMBODIMENTS

First Embodiment

Figure 1:
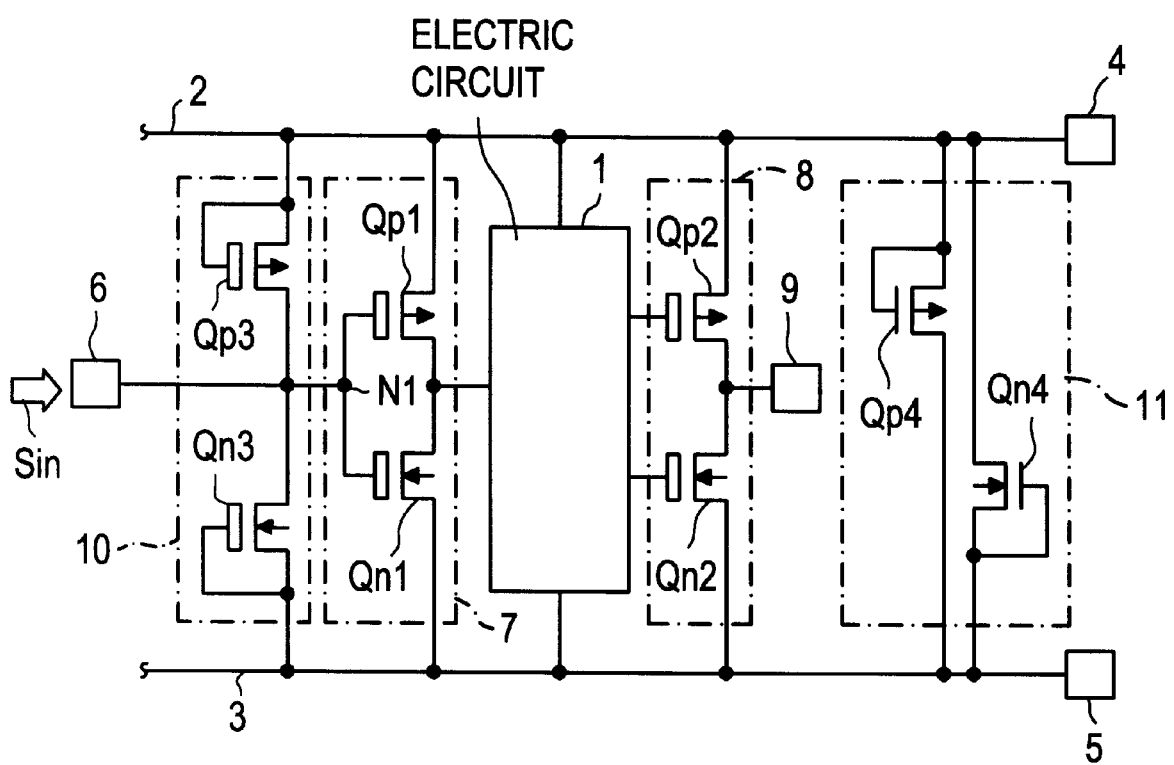
FIG. 1 is a circuit diagram showing the prior art protection circuit.
Figure 2:
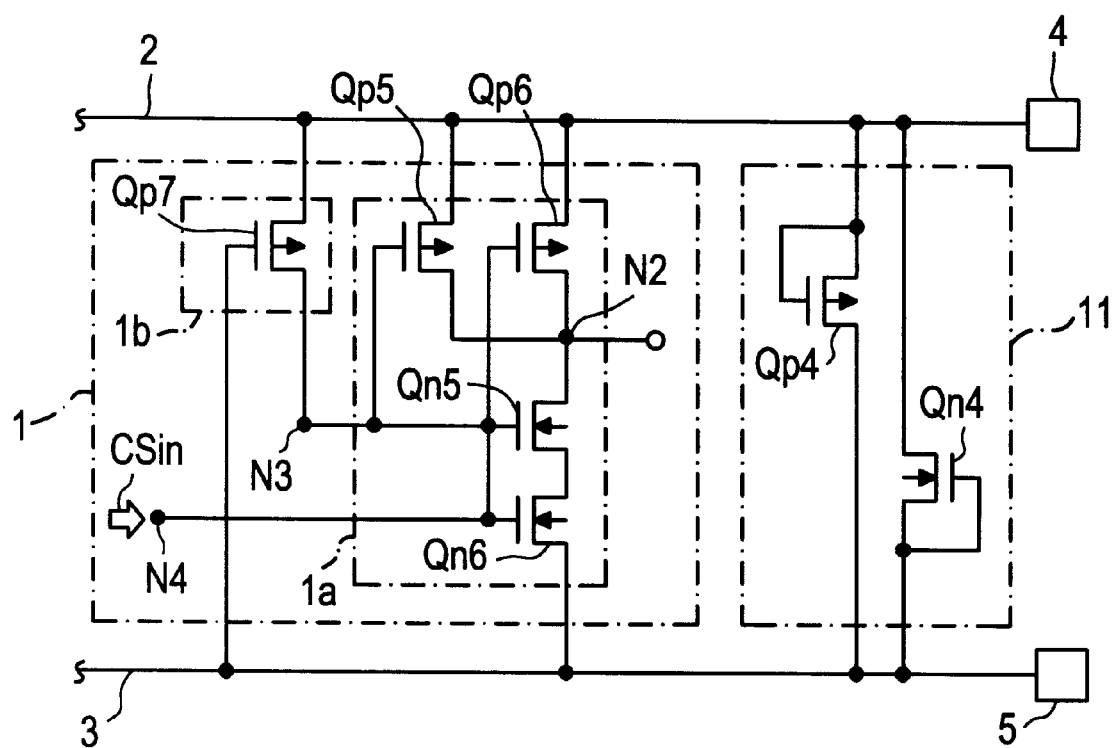
FIG. 2 is a circuit diagram showing the NAND gate associated with the prior art protection circuit disclosed in Japanese Patent Publication of Unexamined Application No. 3-74870.
Figure 3:
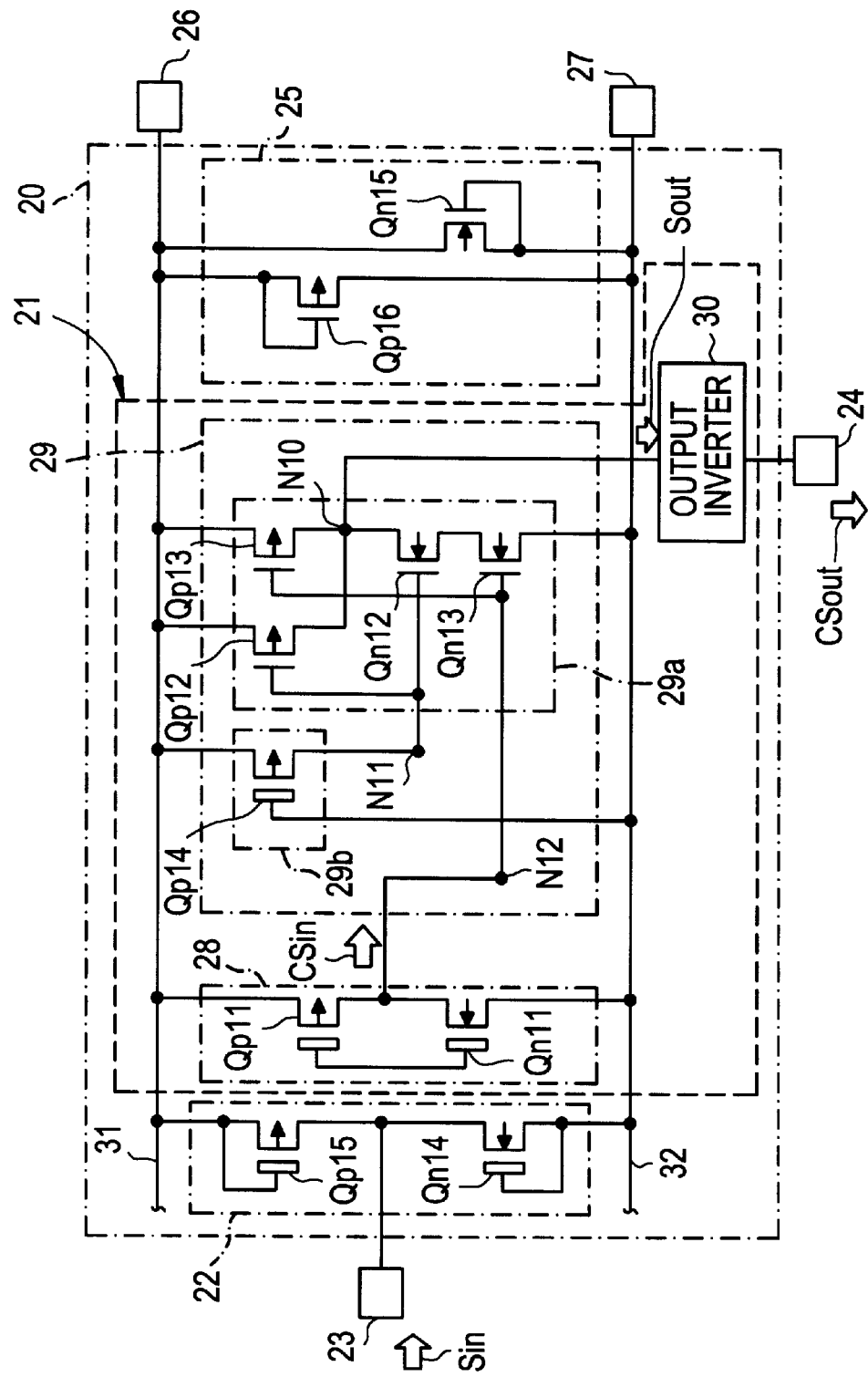
FIG. 3 is a circuit diagram showing the circuit arrangement of a semiconductor integrated circuit device according to the present invention.

Referring to FIG. 3 of the drawings, a semiconductor integrated circuit device is fabricated on a semiconductor chip 20. The semiconductor integrated circuit device largely comprises a main circuit 21, a protection circuit 22 against static charge applied to an input signal terminal 23 and/or an output signal terminal 24 and a protection circuit 25 against static charge applied between a power supply terminal 26 and a ground terminal 27. The main circuit 21 includes an input inverter 28 connected to the input signal terminal 23, a functional circuit 29 connected to the input inverter 28 and an output inverter 30 connected between the functional circuit 29 and the output signal terminal 24. The power supply terminal 26 and the ground terminal 27 are connected to a power supply line 31 and a ground line 32, respectively, and the main circuit 21 is powered with a power voltage on the power supply line 31 and a ground voltage on the ground line 32. Although other functional circuits accompanied with input inverters and output inverters are further incorporated in the main circuit 21, they are omitted from FIG. 3 for the sake of simplicity.

The input inverter 28 is implemented by a series combination of a p-channel enhancement type field effect transistor Qp11 and an n-channel enhancement type field effect transistor Qn11, and the series combination is connected between the power supply line 31 and the ground line 32. The input signal terminal 23 is connected to the gate electrode of the p-channel enhancement type field effect transistor Qp11 and the gate electrode of the n-channel enhancement type field effect transistor Qn11. Though not shown in FIG. 3, the output inverter 30 has the circuit configuration similar to the input inverter 28. An input signal Sin is supplied from the input terminal 23 to the input inverter 28, and the input inverter 28 is responsive to the input signal Sin so as to produce the complementary input signal CSin. The complementary input signal CSin is supplied from the input inverter 28 to the functional circuit 29. An output signal Sout is supplied from the functional circuit 29 to the output inverter 30, and the output inverter 30 is responsive to the output signal Sout so as to produce the complementary output signal CSout. The complementary output signal CSout is supplied from the output inverter 30 to the output terminal 24. The p-channel/n-channel enhancement type field effect transistors Qp11/Qn11 form the input inverter 28 and the output inverter 30, and the gate insulating layers of those component field effect transistors Qp11/Qn11 are thicker than most of the component field effect transistors of the functional circuit 29.

The functional circuit 29 include a two-input NAND gate 29a and a clamping circuit 29b. The two-input node NAND gate 29a includes p-channel enhancement type field effect transistors Qp12/Qp13 connected in parallel between the power supply line 31 and an output node N10 and n-channel enhancement type field effect transistors Qn12/Qn13 connected in series between the output node N10 and the ground line 32. One of the two input nodes N11 is connected to the gate electrode of the p-channel enhancement type field effect transistor Qp12 and the gate electrode of the n-channel enhancement type field effect transistor Qn12, and the other input node N12 is connected to the gate electrode of the p-channel enhancement type field effect transistor Qp13 and the gate electrode of the n-channel enhancement type field effect transistor Qn13. The complementary input signal CSin is supplied from the input inverter 28 through the input node N12 to the gate electrode of the p-channel enhancement type field effect transistor Qp13 and the gate electrode of the n-channel enhancement type field effect transistor Qn13. The other input node N11 is connected through the clamping circuit 29b to the power supply line 31, and the clamping circuit 29b supplies the power voltage to the gate electrode of the p-channel enhancement type field effect transistor Qp12 and the gate electrode of the n-channel enhancement type field effect transistor Qn12 at all times. For this reason, the two-input NAND gate 29a is enabled at all times, and is responsive to the complementary input signal CSin for changing the potential level at the output node N10.

The clamping circuit 29b is implemented by a p-channel enhancement type field effect transistor Qp14. The p-channel enhancement type field effect transistor Qp14 has a source node connected to the power supply line 31, a drain node connected to the input node N11 and a gate electrode connected to the ground line 32. The ground level allows the p-channel enhancement type field effect transistor Qp14 to turn on at all times, and the clamping circuit 29b supplies the power voltage through the input node N11 to the gate electrode of the p-channel enhancement type field effect transistor Qp12 and the gate electrode of the n-channel enhancement type field effect transistor Qn12.

In the function circuit 29, the p-channel enhancement type field effect transistors Qp12/Qp13 and the n-channel enhancement type field effect transistors Qn12/Qn13 respectively have the gate insulating layers thinner than the gate insulating layer of the p-channel enhancement type field effect transistor Qp11 and the gate insulating layer of the n-channel enhancement type field effect transistor Qn11. However, the p-channel enhancement type field effect transistor Qp14 has the gate insulating layer as thick as that of the p-channel enhancement type field effect transistor Qp11. For this reason, even if static charge is applied between the power supply terminal 26 and the ground terminal 27, the gate insulating layer of the p-channel enhancement type field effect transistor Qp14 is hardly damaged.

The protection circuit 22 includes a diode-connected p-channel enhancement type field effect transistor Qp15 and a diode-connected n-channel enhancement type field effect transistor Qn14, and the diode-connected p-channel enhancement type field effect transistor Qp15 and the diode-connected n-channel enhancement type field effect transistor Qn14 are connected between the input signal terminal 23 and the power supply/ground lines 31/32 so as to discharge static charge to the power supply line 31 or the ground line 32. Thus, the input signal terminal 23 is associated with the protection circuit 22. The p-channel enhancement type field effect transistor Qp15 and the n-channel enhancement type field effect transistor Qn14 have the gate insulating layers as thick as those of the field effect transistors Qp11/Qn11.

The other protection circuit 25 is implemented by a diode-connected p-channel enhancement type field effect transistor Qp16 and a diode-connected n-channel enhancement type field effect transistor Qn15, and the diode-connected p-channel enhancement type field effect transistor Qp16 and the diode-connected n-channel enhancement type field effect transistor Qn15 are connected in parallel between the power supply line 31 and the ground line 32. The diode-connected p-channel enhancement type field effect transistor Qp16 and the diode-connected n-channel enhancement type field effect transistor Qn15 have the gate electrodes wider than and shorter than those of the field effect transistors Qp12/Qp13/Qn12/Qn13. However, the gate insulating layers are thinner than that of the p-channel enhancement type field effect transistor Qp14. For this reason, the gate insulating layer of the p-channel enhancement type field effect transistor Qp14 has a break-down voltage higher than the break-down voltage of the p-n junctions of the diode-connected field effect transistors Qp16/Qn15.

When static charge is applied between the power supply line 31 and the ground line 32, the p-n junctions of the diode-connected field effect transistor Qp16/Qn15 are broken down and/or the punch-through takes place between the source region and the drain region. Then, a large amount of current flows into the ground line 32 or the power supply line 31. However, the thick gate insulating layer of the p-channel enhancement type field effect transistor Qp14 well withstands the static charge, and the static charge does not damage the p-channel enhancement type field effect transistor Qp14.

The gate insulating layers are different in thickness, and are grown as follows. Active areas are defined by a field oxide layer, and the insulating material such as silicon dioxide is grown to the least thickness on the active areas assigned to all the field effect transistors. Thereafter, the active areas assigned to the field effect transistors with the least thickness are covered with a photo-resist mask. The photo-resist mask is patterned from a photo-resist layer in developing solution after a pattern transfer from a photo mask. This means that the active areas assigned to the field effect transistors with the thick gate insulating layers are exposed to openings formed in the photoresist mask. The silicon dioxide is further grown on the active areas exposed to the openings, and the thick gate insulating layers are formed on the selected active areas.

Figure 4A:
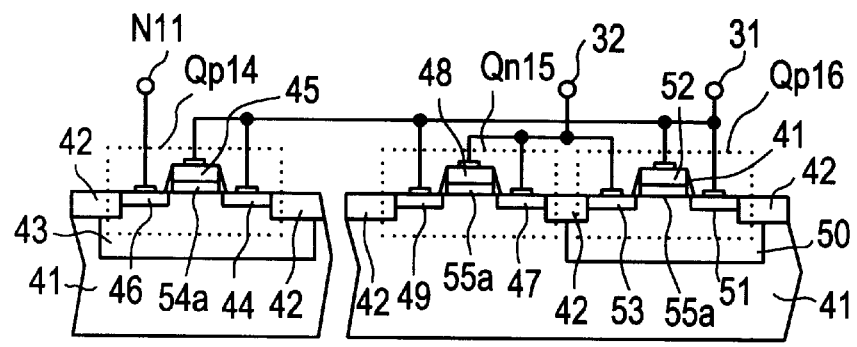
FIG. 4a is a schematic view showing an arrangement of the gate oxide layers of the transistors of the semiconductor integrated circuit device according to the present invention.

FIG. 4a is a schematic view showing that the gate oxide layer 54a of the transistor Qp14, is thicker than the gate oxide layer 55a of the transistors Qn15/Qp16. In FIG. 4a, reference numerals 43 and 50 designate n-type wells, reference numerals 44/46/51/53 designate p+diffused layers, reference numerals 45/48/52 designate gate electrodes, reference numerals 47/49 designate n+diffused layers, and reference numerals 54a/55a designate gate oxide layers. The transistor Qp14 is fabricated on the n-type well 43 defined by the field oxide layer 42 in the p-type semiconductor substrate 41. The p+diffused region 44 and the gate electrode 45 are connected to the power supply line 31, and the p+diffused region 46 is connected to the internal terminal N11. The transistor Qn15 is fabricated on the active region also defined by the field oxide layer 42 grown in the p-type semiconductor substrate 41. The n+diffused region 47 and the gate electrode 48 are connected to the ground line 32, and the n+diffused region 49 is connected to the power supply line 31. The transistor Qp16 is fabricated on the n-type well 50 defined by the field oxide layer 42. The p+diffused region 51 and the gate electrode 52 are connected to the power supply line 31, and the p+diffused region 53 is connected to the ground line 32. The transistors Qn15/Qp16 form in combination a power source protection circuit. Again, the gate oxide layer 54a of the transistor Qp14 is thicker than gate oxide layer 55a of the transistors Qn15/Qp16.

Figure 4B:
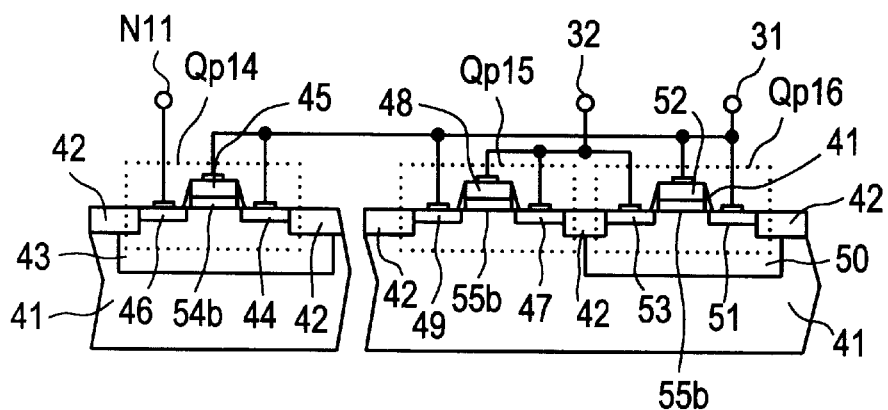
FIG. 4b is a schematic view showing another arrangement of the gate oxide layers of the transistors of the semiconductor integrated circuit device according to the present invention.

FIG. 4b is a schematic cross sectional view showing the gate oxide layer of a transistor Qp14 equal in thickness to those of transistors Qn15/Qp16. Reference numerals 43/50 designate n-type wells, reference numerals 44/46/51/53 designate p+diffused layers, reference numerals 45/48/52 designate gate electrodes, reference numerals 47/49 designate n+diffused layers, and reference numerals 54b/55b designate gate oxide layers. The transistor Qp14 is fabricated on the n-type well 43 defined by the field oxide layer 42 grown on the p-type semiconductor substrate 41. The p+diffused layer 44 and the gate electrode 45 are connected to the power supply line 31, and the p+diffused layer 46 is connected the internal terminal N11. The transistor Qn15 is fabricated on the active region defined by the field oxide layer 42 grown on the p-type semiconductor substrate 41. The n+diffused layer 47 and the gate electrode 48 are connected to the ground line 32, and the n+diffused layer 49 is connected to the power supply line 31. The transistor Qp16 is fabricated on the n-type well 50 defined by the field oxide layer 42 grown on the semiconductor substrate 41. The p+diffused layer 51 and the gate electrode 52 are connected to the power supply line 31, and the p+diffused layer 53 is connected to the ground line 32. The transistors Qn15 and Qp16 form in combination a power source protection circuit. Again, the gate oxide layer 54b of the transistor Qp14 is equal in thickness to gate oxide layer 55b of the transistors Qn15/Qp16.

Assuming now that the manufacturer designs the integrated circuit shown in FIG. 3 under the minimum design rule of 0.2 micron, the diode-connected field effect transistors Qp16/Qn15, the p-channel enhancement type field effect transistor Qp13, the p-channel enhancement type field effect transistors Qp12/Qp13 and the n-channel enhancement type field effect transistors Qn12/Qn13 have the following dimensions. The diode-connected field effect transistors Qp16/Qn15 have the gate electrodes of 50 micron wide and 0.24 micron long, and the gate insulating layers thereof are formed of silicon dioxide equal to 10 nanometers thick. The p-channel enhancement type field effect transistor Qp14 has the gate electrode of 10 micron wide and 0.20 micron long, and the gate insulating layer thereof is formed of silicon dioxide equal to 10 nanometers thick. The p-channel enhancement type field effect transistors Qp12/Qp13 have the respective gate electrodes of 10 micron wide and 0.20 micron long, and the gate insulating layer thereof is formed of silicon dioxide equal to 5 nanometers thick. The n-channel enhancement type field effect transistors Qn12/Qn13 have respective gate electrodes of 10 micron wide and 0.20 micron long, and the gate insulating layers thereof are formed of silicon dioxide equal to 5 nanometers thick. In this situation, the break-down or the punch-through take place in the field effect transistors Qp16/Qp15 at 4.5 volts, and the gate insulating layer of the p-channel enhancement type field effect transistor Qp14 has the break-down voltage at 5.5 volts. Although the break-down voltage of the other field effect transistors Qp12/Qp13/Qn12/Qn13 are of the order of 3.0 volts, the static charge is never directly applied between the gate electrodes and the source/drain regions. Thus, even though the component field effect transistors are scaled down, the protection circuit 25 is still effective against the static charge, and any component field effect transistors Qp12–Qp14 and Qn12–Qn13 of the functional circuit are never damaged by the static charge.

Second Embodiment

Figure 5:
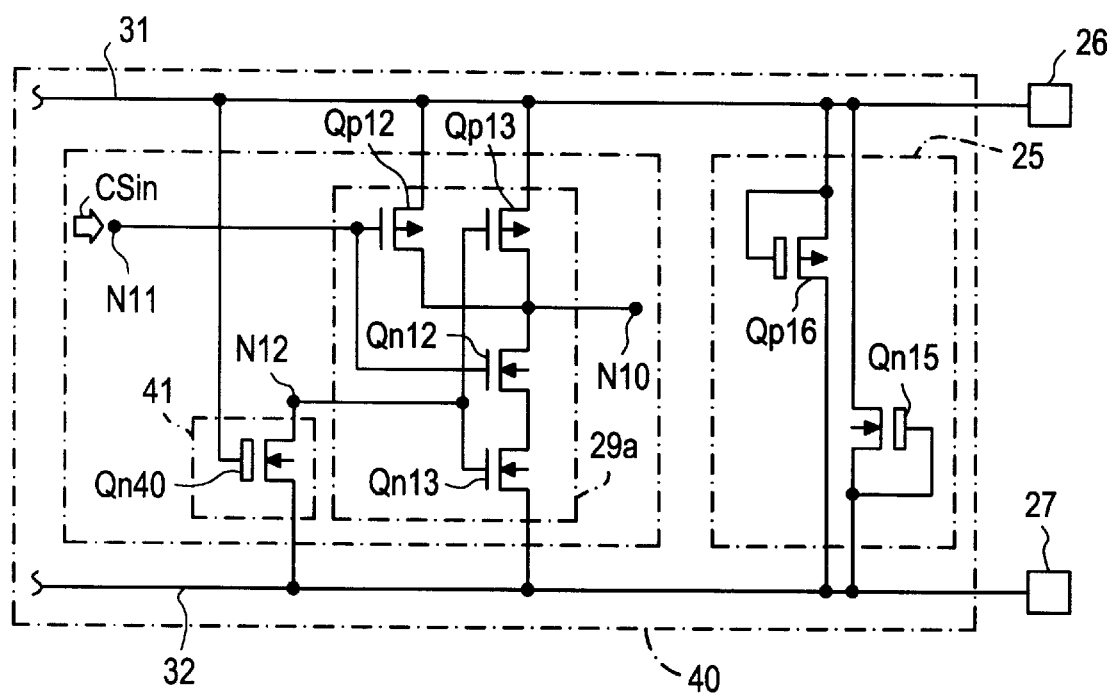
FIG. 5 is a circuit diagram showing the circuit arrangement of another semiconductor integrated circuit device according to the present invention.

Turning to FIG. 5 of the drawings, another integrated circuit device is fabricated on a semiconductor chip 40. The integrated circuit device is similar in arrangement to the integrated circuit shown in FIG. 3 except a clamping circuit 41. For this reason, the other circuits and the circuit components thereof are labeled with the same references designating corresponding circuits and corresponding circuit components shown in FIG. 3 without detailed description.

The clamping circuit 41 is implemented by an n-channel enhancement type field effect transistor Qn40, and the n-channel enhancement type field effect transistor Qn40 has a source node connected to the ground line 32, a drain node connected to the input node N12 and a gate electrode connected to the power supply line 31. The n-channel enhancement type field effect transistor Qn40 is turned on at all times, and supplies the ground level to the gate electrode of the p-channel enhancement type field effect transistor Qp13 and the gate electrode of the n-channel enhancement type field effect transistor Qn13.

The gate insulating layer of the n-channel enhancement type field effect transistor Qn40 is thicker than those of the field effect transistors Qp12/Qp13/Qn12/Qn13, and the thick gate insulating layer has a break-down voltage higher than the break-down voltage of the p-n junctions of the diode-connected field effect transistors Qp16/Qn15 and the punch-through voltage. For this reason, the protection circuit 25 is still effective against static charge applied between the power supply terminal 26 and the ground terminal 27.

Although particular embodiments of the present invention have been shown and described, it will be apparent to those skilled in the art that various changes and modifications may be made without departing from the spirit and scope of the present invention.

For example, the diode-connected field effect transistors Qp16/Qn15 may have the gate electrodes indirectly connected to the power supply line 31 and the ground line 32. Moreover, the diode-connected field effect transistors Qp16/Qn15 may be replaced with punch-through transistors.

If there is a possibility that static charge is applied to the gate electrode of a field effect transistor, the gate insulating layer thereof would be increased in thickness in accordance with the present invention.

The p-channel enhancement type field effect transistor Qp14 or the n-channel enhancement type field effect transistor Qn40 may have the gate insulating layer thicker than those of the field effect transistors Qn15/Qp16.

The present invention is never limited to the clamping circuit. If a field effect transistor has a gate insulating layer applied with the potential difference between the power voltage and the ground voltage, the present invention is applicable to the field effect transistor.

Figure 6:
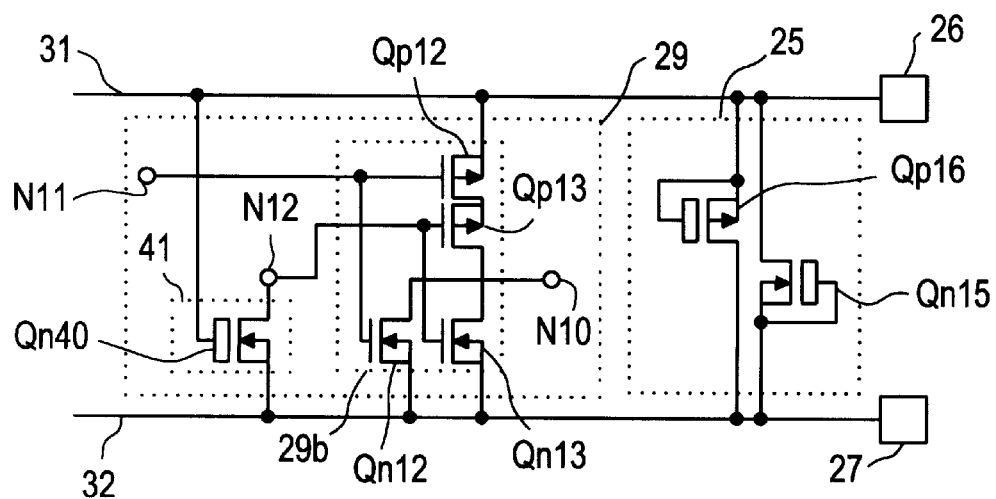
FIG. 6 shows an embodiment where an internal logic circuit is formed by using a NOR gate.

FIG. 6 shows an embodiment where an internal logic circuit is formed by using a NOR gate. In the internal circuit 29, p-channel transistors Qp12/Qp13 and n-channel transistors Qn12/Qn13 form in combination a two-input NOR gate 29b. An n-channel transistor Qn40 has a gate electrode connected to the power supply line 31 so as to be turned on, and the input node N12 of the two-input NOR gate 29b is clamped through the n-channel transistor Qn40 to the ground line 32. The power supply protection is achieved as follows. Between the power supply line 31 connected to the external terminal 26 and the ground line 32 connected to the external terminal 27, the p-channel transistor Qp16 and the n-channel transistor Qn15 are connected, and the p-channel transistor Qp16 and the n-channel transistor Qn15 are designed in such a manner as to have lower drain breakdown voltage and punch-through voltage than transistors Qp12/Qp13/Qn12/Qn13. The gate oxide layer of the n-channel transistor Qn40 of the internal circuit 29 is equal to or greater in thickness than the gate oxide layers of the transistors Qp16/Qn15 forming the power supply protection circuit 25. Although the input node N11 and the output node N10 of the 2-input NOR gate 29b of the internal circuit 29 are connected to other circuits, the connections are not shown in FIG. 6.

What is claimed is:

1. A semiconductor integrated circuit device comprising
at least one signal terminal supplied with an input signal;
a first power supply terminal connected to a first power supply line and supplied with a first power voltage;
a second power supply terminal connected to a second power supply line and supplied with a second power voltage different from said first power voltage;
a main circuit supplied with said input signal for producing an output signal and including
a first field effect transistor having a first gate insulating layer to which is applied a first potential difference between said first power supply line and said second power supply line, said first field effect transistor having a first break-down voltage, and
at least one second field effect transistor having a second gate insulating layer to which is applied a second potential difference smaller than said first potential difference; and
a protective circuit for preventing said main circuit from a static charge, and including
a first protective sub-circuit having p-n junctions spaced from each other, connected in series between said first power supply line and said second power supply line, reversely biased and providing a current path between said first power supply line and said second power supply line due to a punch-through or a break-down of said p-n junctions under application of said static charge at a second voltage lower than said first break-down voltage.

2. The semiconductor integrated circuit device as set forth in claim 1, wherein said p-n junctions define a source region and a drain region of a normally-off type field effect transistor of a first channel conductivity type connected between said first power supply line and said second power supply line.

3. The semiconductor integrated circuit device as set forth in claim 2, wherein said normally-off type field effect transistor has a gate electrode connected to one of said first power supply line and said second power supply line so as not to induce a conductive channel between said source region and said drain region when said static charge is not applied.

4. The semiconductor integrated circuit device as set forth in claim 3, wherein said first gate insulating layer is thicker than said second gate insulating layer, and said first gate insulating layer has a thickness equal to or greater than a thickness of a gate insulating layer of said normally-off type field effect transistor.

5. The semiconductor integrated circuit device as set forth in claim 3, wherein said first protective sub-circuit further has another normally-off type field effect transistor, of a second channel conductivity type opposite to said first channel conductivity type, connected between said first power supply line and said second power supply line, and said another normally-off type field effect transistor has a gate electrode connected to the other of said first power supply line and said second power supply line so as not to induce a conductive channel between a source region and a drain region thereof when said static charge is not applied.

6. The semiconductor integrated circuit device as set forth in claim 5, wherein said first gate insulating layer is thicker than said second gate insulating layer, and said first gate insulating layer has a thickness equal to or greater than a thickness of a gate insulating layer of said normally-off type field effect transistor and also equal to or greater than a thickness of a gate insulating layer of said another normally-off type field effect transistor.

7. The semiconductor integrated circuit device as set forth in claim 1, wherein said at least one second field effect transistor forms a part of a multi-input node function circuit, and said first field effect transistor has a source node connected to said first power supply line, a drain node connected to one of the input nodes of said multi-input node function circuit and a gate electrode connected to said second power supply line.

8. The semiconductor integrated circuit device as set forth in claim 7, wherein said multi-input node function circuit carries out a logic function.

9. The semiconductor integrated circuit device as set forth in claim 8, wherein said multi-input node function circuit carries out a NAND operation.

10. The semiconductor integrated circuit device as set forth in claim 8, wherein said multi-input node function circuit carries out a NOR operation.

11. The semiconductor integrated circuit device as set forth in claim 1, wherein said protective circuit further includes a second protective sub-circuit connected between said at least one signal terminal and said first and second power supply lines for preventing said main circuit from said static charge applied to said at least one signal terminal.

12. The semiconductor integrated circuit device as set forth in claim 11, wherein said second protective sub-circuit includes a third normally-off type field effect transistor connected between said at least one signal terminal and said first power supply line and a fourth normally-off type field effect transistor connected between said at least one signal terminal and said second power supply line.

13. The semiconductor integrated circuit device as set forth in claim 12, wherein said third normally-off type field effect transistor and said fourth normally-off type field effect transistor have respective gate insulating layers thicker than said second gate insulating layer.

14. The semiconductor integrated circuit device as set forth in claim 13, wherein said third normally-off type field effect transistor and said fourth normally-off type field effect transistor protect an input circuit of said main circuit from said static charge.

15. The semiconductor integrated circuit device as set forth in claim 14, wherein said input circuit is a complementary inverter responsive to said input signal for producing a complementary signal of said input signal.

16. The semiconductor integrated circuit device as set forth in claim 15, wherein said complementary inverter is a series combination of a fifth field effect transistor of a first channel conductivity type and a sixth field effect transistor of a second channel conductivity type opposite to said first channel conductivity type, and the fifth field effect transistor and said sixth field effect transistor have respective gate insulating layers thicker than said second gate insulating layer.

* * * * *